US008189617B2

(12) United States Patent
Kagan et al.

(10) Patent No.: US 8,189,617 B2
(45) Date of Patent: *May 29, 2012

(54) SYSTEM AND METHOD FOR SIMULTANEOUS COMMUNICATION ON MODBUS AND DNP 3.0 OVER ETHERNET FOR ELECTRONIC POWER METER

(75) Inventors: Erran Kagan, Great Neck, NY (US); Fredrick Slota, Lake Ronkonkoma, NY (US); Wei Wang, Mahwah, NJ (US); Joseph Spanier, Brooklyn, NY (US)

(73) Assignee: Electro Industries/Gauge Tech, Westbury, NY (US)

( * ) Notice: Subject to any disclaimer, the term of this patent is extended or adjusted under 35 U.S.C. 154(b) by 57 days.

This patent is subject to a terminal disclaimer.

(21) Appl. No.: 12/605,682

(22) Filed: Oct. 26, 2009

(65) Prior Publication Data

US 2010/0046545 A1    Feb. 25, 2010

Related U.S. Application Data

(63) Continuation of application No. 11/087,438, filed on Mar. 23, 2005, now Pat. No. 7,609,719, which is a continuation-in-part of application No. 10/969,592, filed on Oct. 20, 2004, now Pat. No. 7,616,656.

(60) Provisional application No. 60/617,689, filed on Oct. 12, 2004.

(51) Int. Cl.
*H04J 3/16* (2006.01)
*H04J 3/22* (2006.01)

(52) U.S. Cl. ........................... 370/466; 370/469

(58) Field of Classification Search ................. None
See application file for complete search history.

(56) References Cited

U.S. PATENT DOCUMENTS

| 5,650,936 | A | 7/1997 | Loucks et al. |
| 5,736,847 | A | 4/1998 | Van Doorn et al. |
| 5,796,742 | A | 8/1998 | Klotzbach et al. |
| 5,828,576 | A | 10/1998 | Loucks et al. |
| 5,995,911 | A | 11/1999 | Hart |
| 6,000,034 | A | 12/1999 | Lightbody et al. |
| 6,005,759 | A * | 12/1999 | Hart et al. ............ 361/66 |
| D427,533 | S | 7/2000 | Cowan et al. |
| D429,655 | S | 8/2000 | Cowan et al. |
| D435,471 | S | 12/2000 | Simbeck et al. |
| 6,185,508 | B1 | 2/2001 | Van Doorn et al. |
| 6,186,842 | B1 | 2/2001 | Hirschbold et al. |
| D439,535 | S | 3/2001 | Cowan et al. |
| 6,236,949 | B1 | 5/2001 | Hart |

(Continued)

OTHER PUBLICATIONS

Xu Hong, Wang Jianhua, "An Extendable Data Engine based on OPC Spcification"; Computer Standards & Interfaecs 26 (2004) 515-525; Dec. 5, 2003.

*Primary Examiner* — Xavier Szewai Wong
(74) *Attorney, Agent, or Firm* — Gerald E. Hespos; Michael J. Porco

(57) ABSTRACT

A system and method is provided for simultaneous communications on Modbus and DNP 3.0 over Ethernet for an electronic power meter. The system incorporates one or more protocol wrappers to provide compatibility with both Modbus and DNP based applications. The system removes the appropriate wrappers and routes the incoming data packet to its destination. Additionally, the system also wraps outgoing response packets with the appropriate protocol wrapper based on the related data packet wrappers.

44 Claims, 6 Drawing Sheets

U.S. PATENT DOCUMENTS

| | | | |
|---|---|---|---|
| D443,541 S | 6/2001 | Hancock et al. | |
| 6,397,155 B1 | 5/2002 | Przydatek et al. | |
| D458,863 S | 6/2002 | Harding et al. | |
| D459,259 S | 6/2002 | Harding et al. | |
| 6,493,644 B1 | 12/2002 | Jonker et al. | |
| 6,563,697 B1 | 5/2003 | Simbeck et al. | |
| 6,567,404 B1 | 5/2003 | Wilford | |
| 6,578,084 B1 | 6/2003 | Moberg et al. | |
| 6,611,773 B2 | 8/2003 | Przydatek et al. | |
| 6,611,922 B2 | 8/2003 | Ozcetin et al. | |
| 6,615,147 B1 | 9/2003 | Jonker et al. | |
| 6,636,030 B1 | 10/2003 | Rose et al. | |
| 6,671,635 B1 | 12/2003 | Forth et al. | |
| 6,671,654 B1 | 12/2003 | Forth et al. | |
| 6,687,627 B1 | 2/2004 | Gunn et al. | |
| 6,694,270 B2 | 2/2004 | Hart | |
| 6,735,535 B1 | 5/2004 | Kagan et al. | |
| 6,737,855 B2 | 5/2004 | Huber et al. | |
| 6,745,138 B2 | 6/2004 | Przydatek et al. | |
| 6,751,562 B1 | 6/2004 | Blackett et al. | |
| 6,751,563 B2 | 6/2004 | Spanier et al. | |
| 6,792,337 B2 * | 9/2004 | Blackett et al. | 700/295 |
| 6,792,364 B2 | 9/2004 | Jonker et al. | |
| 6,798,190 B2 | 9/2004 | Harding et al. | |
| 6,798,191 B1 | 9/2004 | Macfarlane et al. | |
| 6,813,571 B2 | 11/2004 | Lightbody et al. | |
| 6,825,776 B2 | 11/2004 | Lightbody et al. | |
| 6,853,978 B2 | 2/2005 | Forth et al. | |
| 6,871,150 B2 | 3/2005 | Huber et al. | |
| D505,087 S | 5/2005 | Ricci et al. | |
| 6,894,979 B1 | 5/2005 | Lee | |
| 6,944,555 B2 | 9/2005 | Blackett et al. | |
| 6,957,158 B1 | 10/2005 | Hancock et al. | |
| 6,961,641 B1 | 11/2005 | Forth et al. | |
| 6,983,211 B2 | 1/2006 | Cowan et al. | |
| 6,988,025 B2 | 1/2006 | Ransom et al. | |
| 6,988,182 B2 | 1/2006 | Teachman et al. | |
| 6,990,121 B1 | 1/2006 | Stiles et al. | |
| 6,990,395 B2 | 1/2006 | Ransom et al. | |
| 7,006,934 B2 | 2/2006 | Jonker et al. | |
| 7,010,438 B2 | 3/2006 | Hancock et al. | |
| 7,072,779 B2 | 7/2006 | Hancock et al. | |
| 7,085,824 B2 | 8/2006 | Forth et al. | |
| 7,089,089 B2 | 8/2006 | Cumming et al. | |
| 7,127,328 B2 | 10/2006 | Ransom | |
| D532,747 S | 11/2006 | Ricci et al. | |
| 7,136,384 B1 | 11/2006 | Wang | |
| D534,120 S | 12/2006 | Ricci et al. | |
| 7,155,350 B2 | 12/2006 | Kagan | |
| 7,158,050 B2 | 1/2007 | Lightbody et al. | |
| 7,174,258 B2 | 2/2007 | Hart | |
| 7,174,261 B2 | 2/2007 | Gunn et al. | |
| 7,256,709 B2 | 8/2007 | Kagan | |
| 7,262,709 B2 | 8/2007 | Borleske et al. | |
| 7,294,997 B2 | 11/2007 | Kagan | |
| 7,304,586 B2 | 12/2007 | Wang et al. | |
| 7,609,719 B2 * | 10/2009 | Kagan et al. | 370/466 |
| 7,616,656 B2 | 11/2009 | Wang et al. | |
| 2002/0114326 A1 | 8/2002 | Mahalingaiah | |
| 2002/0162014 A1 | 10/2002 | Przydatek et al. | |
| 2002/0165677 A1 | 11/2002 | Lightbody et al. | |
| 2002/0169570 A1 | 11/2002 | Spanier et al. | |
| 2002/0191640 A1 | 12/2002 | Haymes et al. | |
| 2003/0014200 A1 | 1/2003 | Jonker et al. | |
| 2003/0065459 A1 | 4/2003 | Huber et al. | |
| 2003/0076242 A1 | 4/2003 | Burns et al. | |
| 2003/0101008 A1 | 5/2003 | Hart | |
| 2003/0105608 A1 | 6/2003 | Hart | |
| 2003/0132742 A1 | 7/2003 | Harding et al. | |
| 2003/0147420 A1 | 8/2003 | Beckwith | |
| 2003/0154471 A1 | 8/2003 | Teachman et al. | |
| 2003/0210699 A1 | 11/2003 | Holt et al. | |
| 2003/0212512 A1 | 11/2003 | Hart | |
| 2003/0220752 A1 | 11/2003 | Hart | |
| 2004/0037313 A1 | 2/2004 | Gulati et al. | |
| 2004/0066311 A1 | 4/2004 | Giles et al. | |
| 2004/0138786 A1 | 7/2004 | Blackett et al. | |
| 2004/0138787 A1 | 7/2004 | Ransom et al. | |
| 2004/0138835 A1 | 7/2004 | Ransom et al. | |
| 2004/0172207 A1 | 9/2004 | Hancock et al. | |
| 2004/0183522 A1 | 9/2004 | Gunn et al. | |
| 2004/0229578 A1 | 11/2004 | Lightbody et al. | |
| 2005/0002417 A1 | 1/2005 | Kelly et al. | |
| 2005/0017874 A1 | 1/2005 | Lightbody et al. | |
| 2005/0027464 A1 | 2/2005 | Jonker et al. | |
| 2005/0071106 A1 | 3/2005 | Huber et al. | |
| 2005/0256964 A1 | 11/2005 | Dube | |
| 2005/0275397 A1 | 12/2005 | Lightbody et al. | |
| 2005/0288876 A1 | 12/2005 | Doig et al. | |
| 2005/0288877 A1 | 12/2005 | Doig et al. | |
| 2006/0052958 A1 | 3/2006 | Hancock et al. | |
| 2006/0071813 A1 | 4/2006 | Kagan | |
| 2006/0077999 A1 | 4/2006 | Kagan et al. | |
| 2006/0170409 A1 | 8/2006 | Kagan et al. | |
| 2006/0187956 A1 | 8/2006 | Doviak et al. | |
| 2006/0230394 A1 | 10/2006 | Forth et al. | |
| 2006/0271244 A1 | 11/2006 | Cumming et al. | |
| 2008/0154523 A1 * | 6/2008 | Gilbert et al. | 702/62 |
| 2010/0046545 A1 | 2/2010 | Kagan et al. | |

* cited by examiner

SYSTEM AND METHOD FOR SIMULTANEOUS COMMUNICATION ON MODBUS AND DNP 3.0 OVER ETHERNET FOR ELECTRONIC POWER METER

The present application is a continuation application of U.S. application Ser. No. 11/087,438 filed on Mar. 23, 2005, which a continuation-in-part application of U.S. application Ser. No. 10/969,592 filed on Oct. 20, 2004 by Kagan et al. entitled "SYSTEM AND METHOD FOR PROVIDING COMMUNICATION BETWEEN INTELLIGENT ELECTRONIC DEVICES VIA AN OPEN CHANNEL", the entire contents of which are hereby incorporated by reference. In addition, the present application claims priority to a U.S. provisional patent application filed on Oct. 12, 2004 and assigned Application Ser. No. 60/617,689, the contents of which are incorporated herein by reference.

BACKGROUND

1. Field of the Disclosure

The present disclosure relates generally to monitoring and control of metering systems. More particularly, the present disclosure relates to systems and methods for simultaneous communications on Modbus and DNP 3.0 over Ethernet for an electronic power meter.

2. Description of the Related Art

The metering architecture that exists in the power utility field today is geared toward providing enough information to accurately monitor and control a variety of metering devices installed at numerous substations. To achieve these objectives, it is essential that communication between a central utility station and substations be time- and cost-efficient, quick updating, as well as reliable.

Historically, meters measuring electrical energy have used measurement devices, which mechanically monitor the subscriber's usage and display a reading of the usage at the meter itself. Consequently, the reading of these meters has required that human meter readers physically go to the site of the meter and manually document the readings. Clearly, this approach relies very heavily on human intervention and, thus, is very costly, time-consuming, and prone to human error. As the number of meters in a typical utility's service region has increased, in some cases into the millions, human meter reading has become prohibitive in terms of time and money.

Over time, these conventional meters were made using microprocessor technologies, which enabled them to be read using a serial protocol and interface. This enabled the meters to be used in series to obtain readings back at a remote terminal unit (RTU) for remote SCADA (Supervisory Control and Data Acquisition) interrogation. For example, FIG. 1 is a schematic view of a conventional system for monitoring and controlling a plurality of substations. That is, referring to FIG. 1, meters 1, 2, and 3 can communicate serially through each other. However, in order for a SCADA master 5 to receive information from meter 3, the information must be passed from meter 3 to meter 2, from meter 2 to meter 1, from meter 1 to an RTU 4, and from the RTU 4 to the SCADA master 5.

Realization of such communication may be accomplished by a standard open protocol known as DNP 3.0. This protocol is configured to provide the power utility with a serial language to speak to the substations and to allow the utility to use outage detection software, generically labeled in the industry as SCADA. In other words, communication between each of the meters and, for example, a central station is realized through a respective serial port and is thus limited to a respective pair coupled to one another via a dedicated channel. DNP 3.0 is optimized for a round-robin type disturbance awareness response.

Furthermore, utility companies communicate to metering and data telemetry devices in substations using different serial based protocols. Different departments within a given utility company have standardized on different protocols which are optimized for the applications they have. For instance, while SCADA systems operate at peak performance using the DNP 3.0 protocol, this protocol is inefficient and difficult to manage when applied to metering departments, system planning, and estimation and power plant DCS systems. As products became more sophisticated, these differing departments wanted to obtain data from one instrument that gave them all the needed disturbance and recorded data. To date, these various departments have had to install separate equipment in substations, separate serial channels, and a variety of protocols to access the data of the monitoring instrument. This is often a costly endeavor, thus a need exists for a system for simultaneously communicating in a plurality of protocols between a monitoring instrument and the various departments in a central utility station. Furthermore, there has been a desire in the industry to eliminate serial protocols and channels and have the various data transmitted over LANs (local area networks) using dedicated T1 or frame relay networks.

SUMMARY

The above and other aspects are attained by a metering apparatus and system for monitoring and controlling a plurality of metering devices in the field of energy use/control.

In accordance with one aspect of the disclosure, a system is provided for simultaneous communications between a host device and a plurality of applications using multiple industry standard communications protocols. The system includes a means for receiving a data packet over an Ethernet connection via an Ethernet card. The data packet is transmitted using a first protocol. This transmission is accomplished by enclosing the data packet with an Ethernet protocol wrapper. A means for removing the Ethernet protocol wrapper is also included, along with a means for determining a secondary protocol used by the data packet. Additionally, the disclosed system has a means for routing the data packet according to predetermined paths selected based on the secondary protocol and a means for providing a response packet using the secondary protocol of the data packet. Further, the system utilizes a means for appending an Ethernet protocol wrapper to the response packet and a means for transmitting the response packet over the Ethernet connection.

In accordance with another aspect of the disclosure, a method for providing simultaneous communications between a host device and a plurality of applications using multiple industry standard communications protocols is provided. The method begins with receiving a data packet over an Ethernet connection via an Ethernet card, the data packet having an Ethernet protocol wrapper. The Ethernet protocol wrapper is removed. A secondary protocol, used by the data packet, is determined. The data packet is then routed according to predetermined paths selected based on the secondary protocol. Upon completing its predetermined path, a response packet using the secondary protocol of the data packet is provided. An Ethernet protocol wrapper is appended to the response packet, and the response packet is finally transmitted over the Ethernet connection.

In accordance with yet another aspect of the disclosure, a metering device is configured with an IED COM processor, operative to perform multiple tasks, and an IED Network Adapter or card built in the metering device and coupled to the processor. The card is configured to format and send data from the processor using DNP 3.0 protocol via an open socket into Ethernet TCP/IP.

According to a further aspect of the disclosure, a plurality of substations, each of which is provided with at least one metering device of the disclosure, are coupled together in a system capable of transmitting the data from each substation to either the RTU and further to the SCADA master or directly to the latter without using a dedicated serial cable or channel.

Still a further aspect of the disclosure is concerned with a system configured to provide communication between a local area network including a plurality of the metering devices of the disclosure and the Internet.

In another aspect, an electric power meter providing real time revenue calculations as well as power quality metering is provided. The power meter actively updates a number of users over the Internet in real time. A user can be utility personnel or customers. The power meter is also capable of communicating through several ports using several different communication protocols simultaneously. The interfaces, including web pages, are user definable and configurable. The meter is installable as a socket type meter, a panel mounted meter, a switchboard mounted meter, or a circuit breaker meter.

In one embodiment of the present disclosure, a web server provides real time data through an Hypertext Markup Language (HTML) or Extensible Markup Language (XML) interface. Additionally, the web server allows viewing of stored historical and power quality data and provides users with an interface for retrieval of historical data via industry standard protocols including Hypertext Transfer Protocol (HTTP) and File Transfer Protocol (FTP).

In another embodiment of the present disclosure, the web server operates as a Modbus Transmission Control Protocol/Internet Protocol (TCP/IP) Gateway for the power meter and existing serial based devices that connect through a network serial port to allow data be monitored or transferred via a network infrastructure.

In a further embodiment of the present disclosure, a socket-type electric power meter provides concurrent operation of a web server, Modbus TCP and additional protocols which are supported by the power meter, thus allowing the power meter to be easily incorporated into existing power control systems as well as providing access to real-time web information, such as the revenue calculations, metering data and power quality data, using a standard web browser.

BRIEF DESCRIPTION OF THE DRAWINGS

These and other features, aspects, and advantages of the present invention will become better understood with regard to the following description, appended claims, and accompanying drawings wherein:

DETAILED DESCRIPTION OF THE PREFERRED EMBODIMENTS

Figure 1:
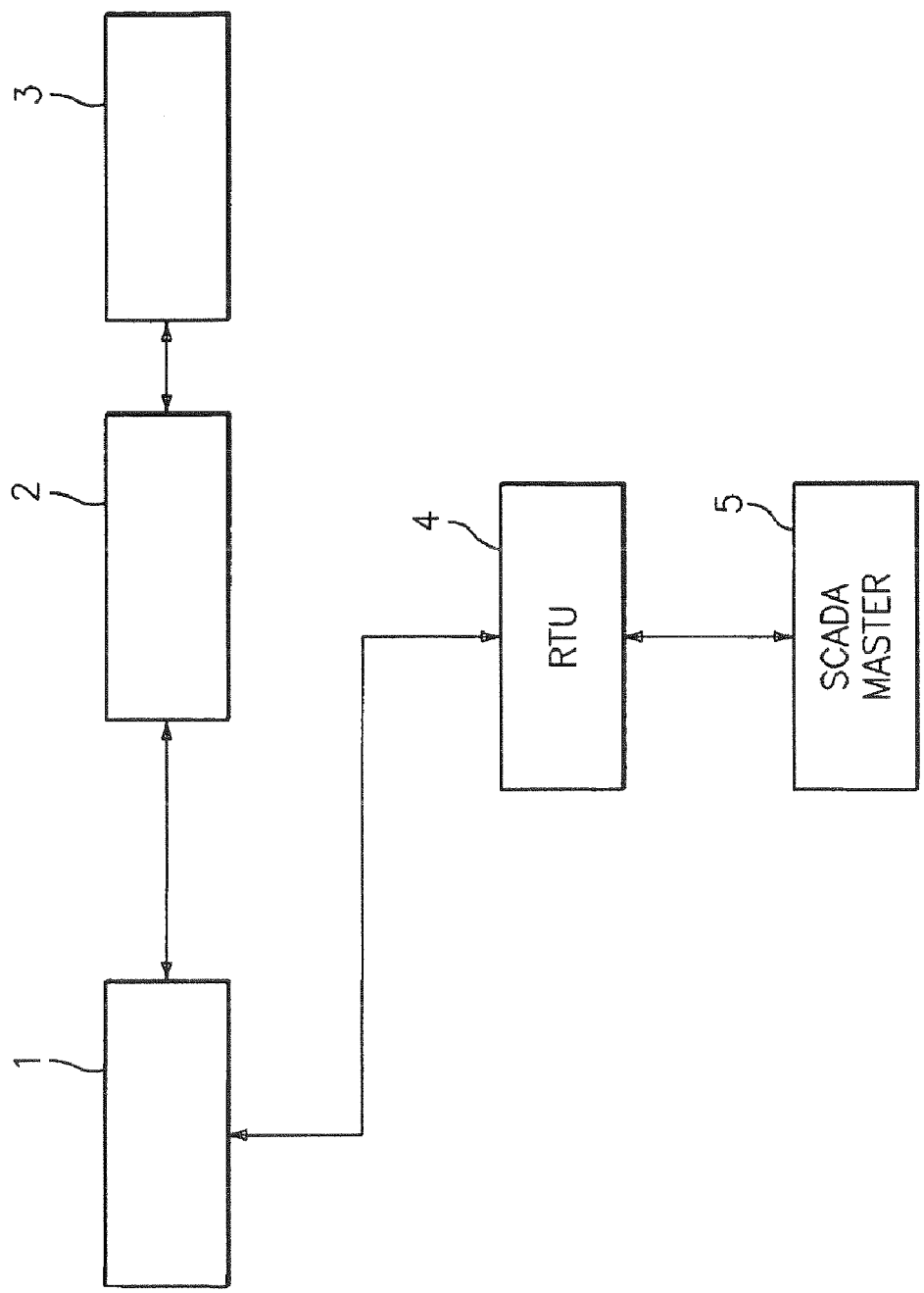
FIG. 1 is a schematic view of a conventional system for monitoring and controlling a plurality of substations.
Figure 2:
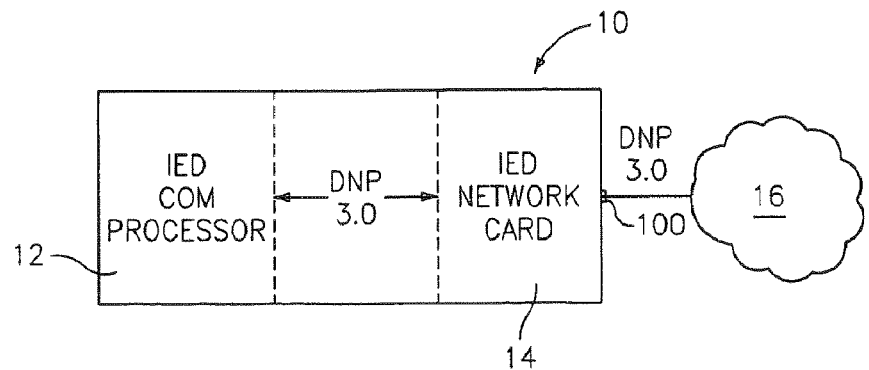
FIG. 2 is a schematic view of a metering device configured in accordance with the disclosure.
Figure 3:
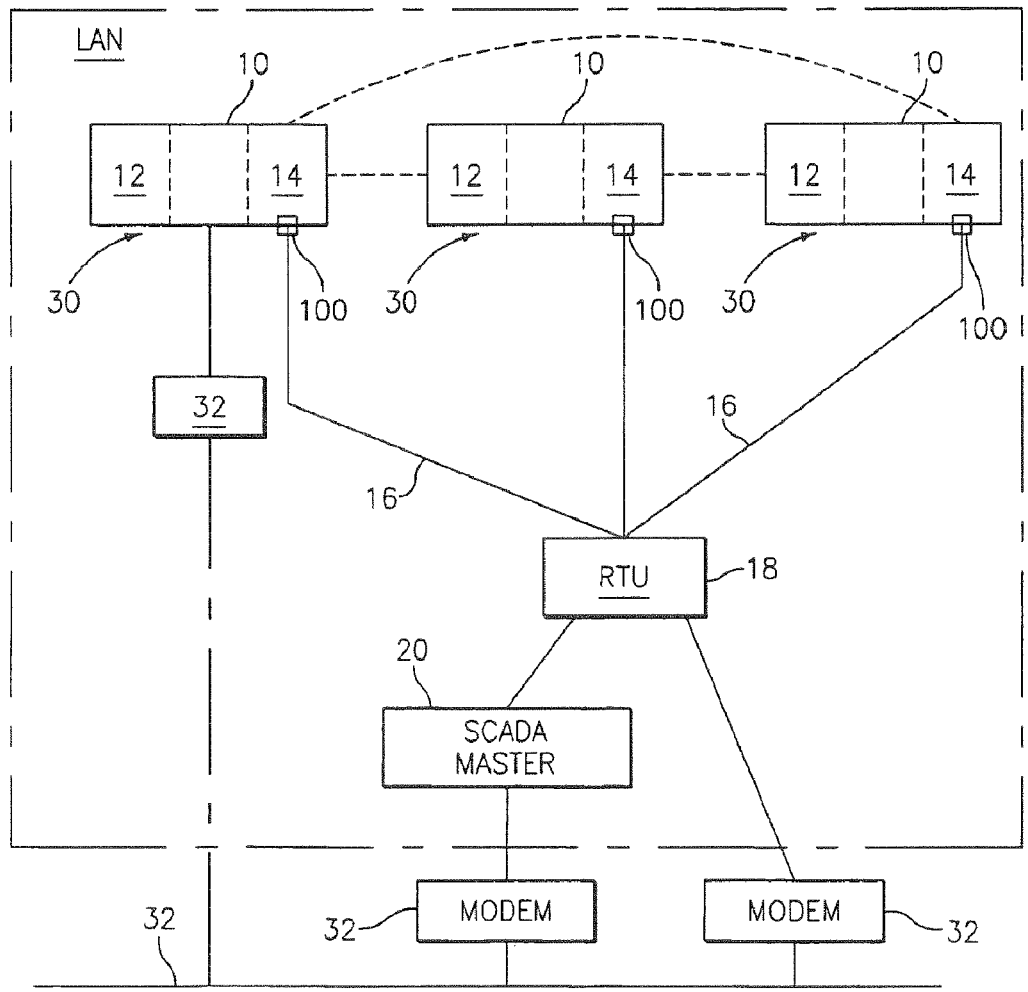
FIG. 3 is a schematic view of a system for monitoring and controlling a plurality of substations each provided with at least one metering device of FIG. 2.

Referring to FIGS. 2 and 3, a metering device 10 is configured as an intelligent electronic metering device (IEMD). Functions of the IEMD 10 may include voltage transformation, regulation and control, power-factor (e.g., capacitor-bank) and load balancing, monitoring, protection of hardware, etc.

The IEMD 10 includes an IED COM processor 12 (FIG. 2) and a built-in IED Network Card 14 coupled to the processor 12 and operative to receive and transmit data between the IEMD 10 and a remote unit through an open socket 100 within an Ethernet TCP/IP medium 16 (FIGS. 2 and 3). Unlike a conventional IEMD communicating with a remote terminal unit (RTU) or SCADA master via a dedicated channel, the card 14 adapts a serial message from or to the processor 12 using the DNP 3.0 so as to receive and transmit the message via the Ethernet medium 16.

As illustrated in FIG. 2, the card 14 strips a message from the open socket 100 channel within the Ethernet and sends it through a serial message or command to processor 12 in accordance with the prescribed DNP 3.0 protocol. In return, the processor 12 generates a serial response, including for example, a measurement requested by the SCADA, and adapted by the card 14 for sending this response via the Ethernet medium.

More specifically, the card 14 recognizes DNP by identifying an Internet Protocol (TCP, UDP, etc.). After retrieving the DNP data, the card 14 sends this data to the processor 12 over a serial channel. For this serial communication, the card 14 and the processor 12 use a predetermined protocol for faster data transfer. The predetermined protocol is only used internally between the card 14 and the processor 12. Accordingly, this protocol has its own headers and footers.

In the protocol, the DNP response is transferred to the card 14 through the serial message. When the card 14 receives this message, the DNP response is prepared with TCP/IP Header for Ethernet medium. A flow diagram illustrating this procedure is illustrated in FIG. 4.

Figure 4:
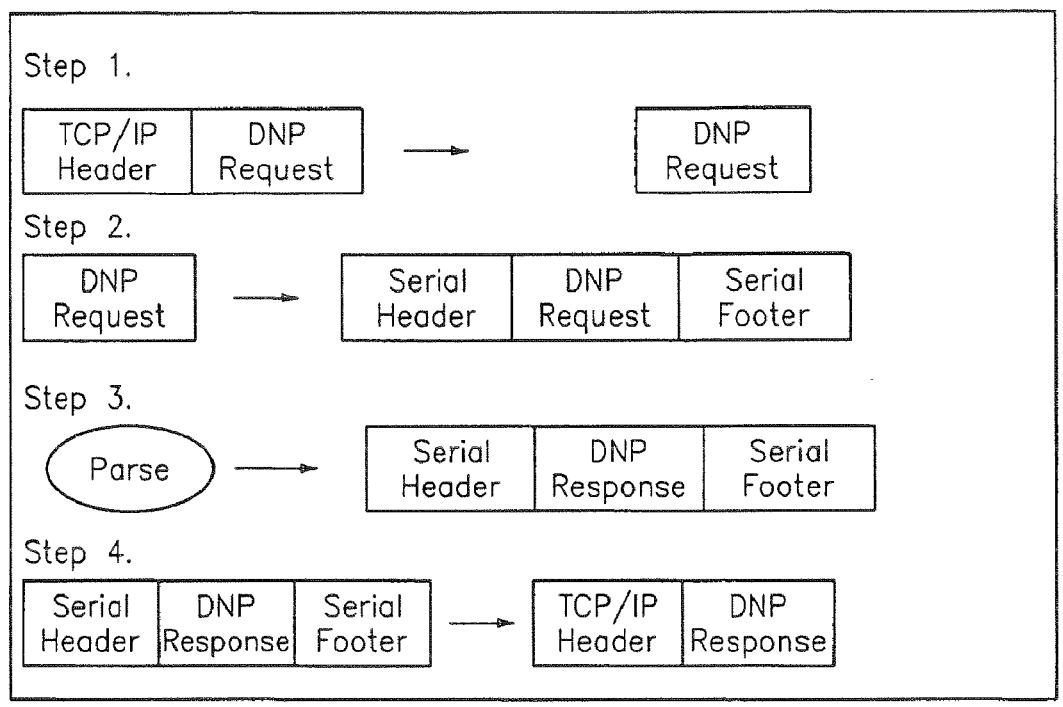
FIG. 4 is a flow diagram illustrating a method of using DNP according to an embodiment of the present disclosure.

Referring to FIG. 4, in Step 1 the card 14 recognizes the data by TCP/IP Header and Footer from the Network and strips the Header and Footer. In Step 2, the card 14 builds another Header and Footer for serial communication and transmits DNP Request to the processor 12 of the unit. In step 3, the processor 12 parses the DNP Request and a DNP response is generated. This DNP response is sent out to the card 14. Thereafter, in Step 4, the card 14 receives this DNP Response and builds TCP/IP Header and Footer. This DNP Response is sent out to the Network.

Accordingly, utilizing the inventive IEMD device, which is provided with the card 14, allows the generated data to be transmitted over the LAN to either the RTU 18 (FIG. 3) or to the SCADA master 20 itself, not through a dedicated serial cable, but through the open socket 100 within the Ethernet TCP/IP medium.

Accordingly, the inventive device 10 provides significantly higher speed outputs and eliminates the need for dedicated serial channels or dedicated wiring. Further, using the TCP/IP technology enables the metering devices to communicate, and also enables them to simultaneously communicate through more than one channel. As a result, readings can be brought back to the SCADA while other software packages can be used to interrogate the metering devices for other purposes, e.g., remote fault interrogation.

In accordance with a further embodiment of the disclosure, the inventive device 10 enables the power Utility to transmit the data via the Internet. As illustrated in FIG. 3, each device 10, defining a respective substation 30, may be directly connected to the Internet medium 32 by a coupler including a cable modem or DSL 32 (FIG. 3). Alternatively or in addition, multiple stations each including the inventive device 10 may be connected to the RTU 18 via the Ethernet medium 16 and to the SCADA master 20 via the Internet medium 32. This provides faster, more reliable communication at a much lower cost since dedicated telephone lines, radio, or other similar infrastructure does not need to be in place. Additionally, the present disclosure provides much more connectivity between devices, enables simultaneous updates from the entire system, and provides increased efficiency as no serial daisy chains are used.

Figure 5:
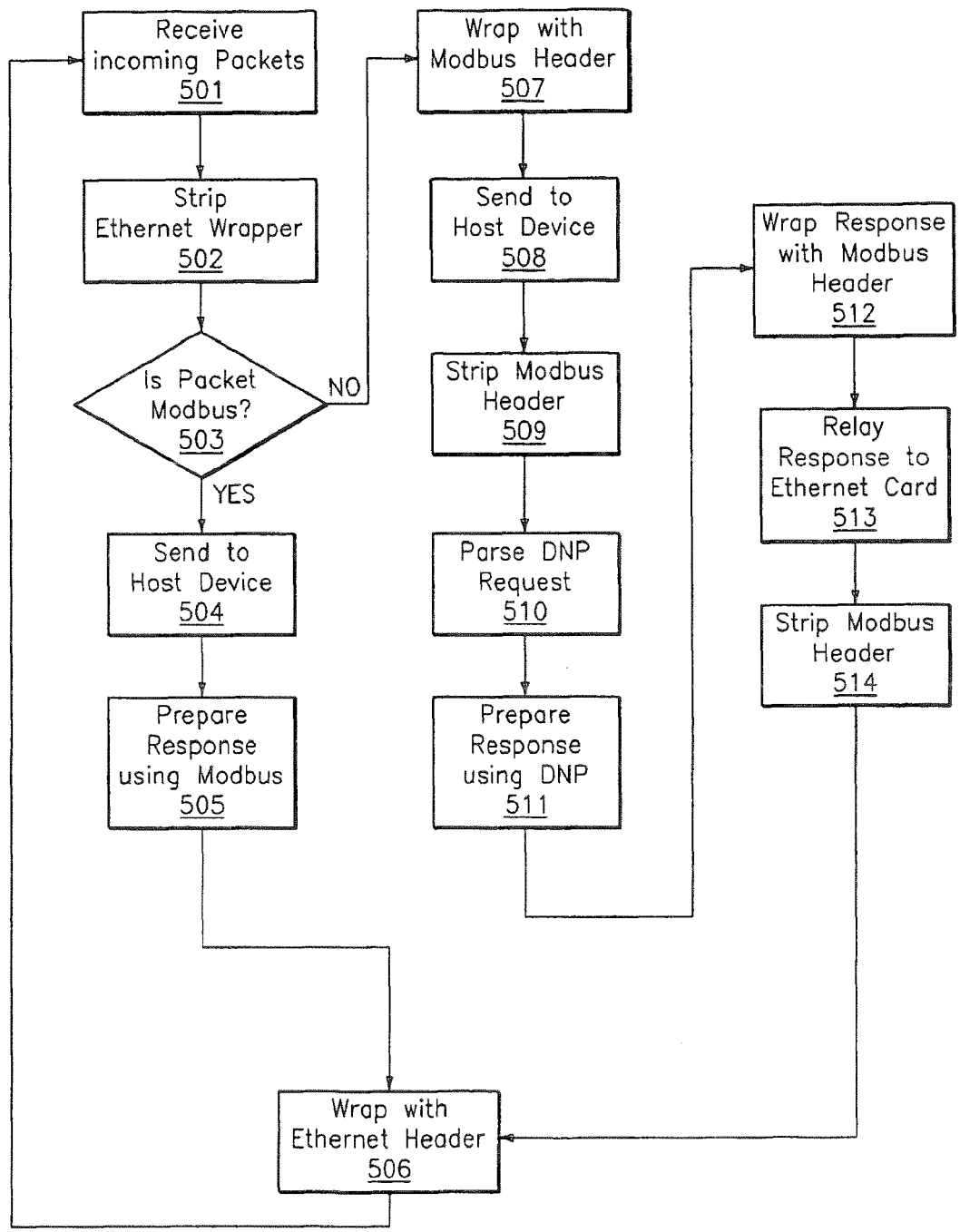
FIG. 5 is a flow diagram illustrating a method of using an Ethernet wrapper with multiple utility industry protocols according to an embodiment of the present disclosure.

As shown in FIG. 5, an alternative embodiment of the present disclosure provides a method for interoperable communications between a power meter and a plurality of applications using several industry standard communications protocols.

The method of the present embodiment begins with step 501 wherein a data packet is received by an Ethernet card 14 (FIG. 2) installed in a power meter, e.g., IEMD 10. The Ethernet card 14 strips the Ethernet protocol wrapper from the data packet in step 502. Proceeding to step 503, the packet is inspected to determine, which secondary communications protocol is being used, e.g., Modbus, DNP, etc.

If the data packet is using the Modbus protocol, the method proceeds to step 504, wherein the data packet is sent to the host device, in this case the power meter 10. In the power meter 10, the data packet is parsed and a response is prepared using the Modbus protocol, in step 505. The response packet is forwarded to the Ethernet card 14, an Ethernet wrapper is appended, and the wrapped response packet is transmitted over a connected Ethernet network 16 in step 506. The method then loops back to step 501 to await receipt of the next data packet.

Alternatively, if the data packet is determined to be using DNP (Distributed Network Protocol) in step 503, the Ethernet card 14 strips the Ethernet wrapper and a Modbus wrapper is appended to the DNP data packet in step 507. Subsequently, in step 508, the Modbus wrapped data packet is transferred to the power meter. In step 509, the Modbus wrapper is removed. The remaining DNP packet is parsed in step 510 and a response is prepared using DNP in step 511. A Modbus wrapper is appended to the response packet, in step 512, and the wrapped response packet is then relayed to the Ethernet card in step 513. In step 514, the Modbus wrapper is removed from the response packet. The method then proceeds to step 506 and continues as described above.

The present embodiment allows interoperability with multiple software systems using different communication protocols simultaneously. Having the host device and Ethernet card communicate via a serial channel allows both DNP and Modbus packets to be transferred to the host without corruption or conflict. Arbitration and high-speed protocol switching, which could negatively affect performance, is not required. Using the methods and systems of the disclosure, connections to 12 systems using different protocols can be maintained simultaneously over an Ethernet connection.

Figure 6:
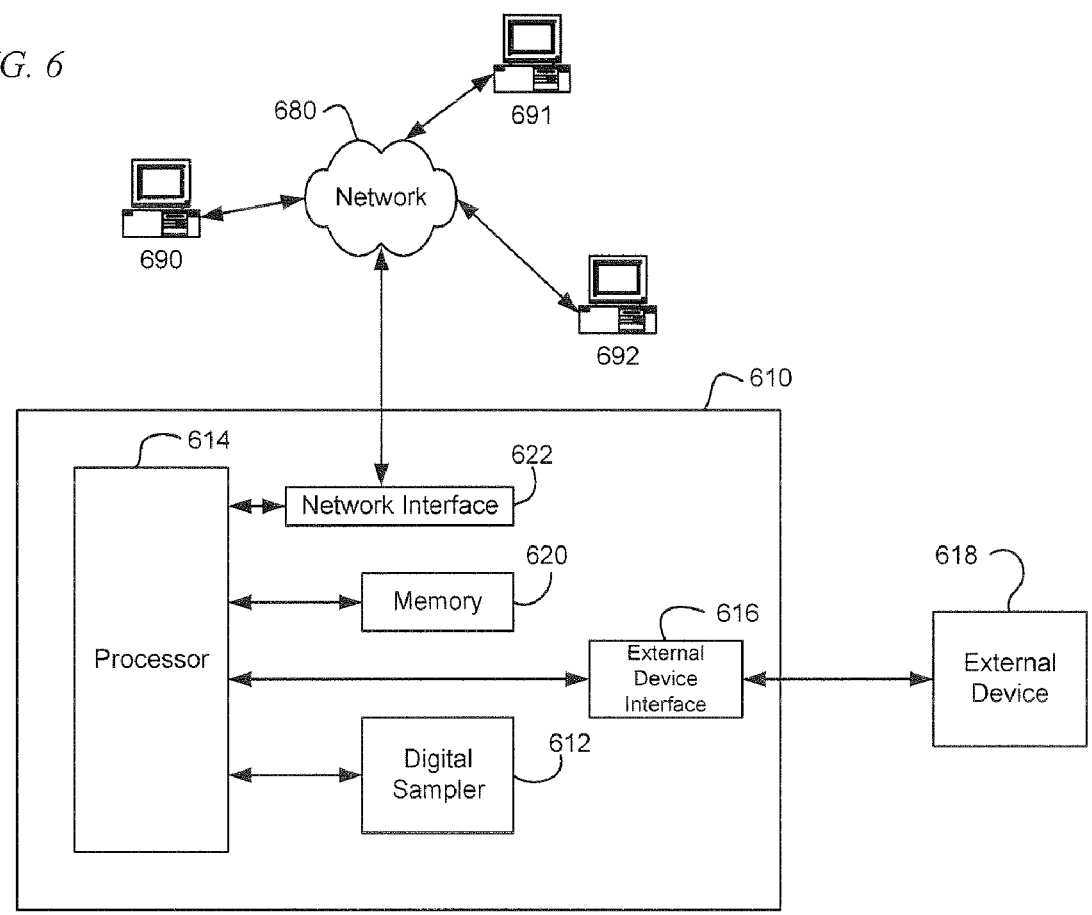
FIG. 6 is a block diagram of a power quality and revenue meter according to an embodiment of the present disclosure.

FIG. 6 is a block diagram of a web server power quality and revenue meter according to another embodiment of the present disclosure, such a web server power quality and revenue meter being described in U.S. Pat. No. 6,751,563, which was incorporated by reference in U.S. Provisional Application Ser. No. 60/617,689. Shown in FIG. 6 are power quality and revenue meter (meter) 610. The meter is connected to monitor electric distribution power lines (not shown), to monitor voltage and current at the point of connection. Included therein is digital sampler 612 for digitally sampling the voltage and current of the power being supplied to a customer or monitored at the point of the series connection in the power grid. Digital sampler 612 digitally samples the voltage and current. The digital samples are then forwarded to processor 614 for processing. Also connected to processor 614 is external device interface 616 for providing an interface for external devices 618 to connect to meter 610. These external devices might include other power meters, sub-station control circuitry, on/off switches, etc. Processor 614 receives data packets from digital sampler 612 and external devices 618, and processes the data packets according to user defined or predefined requirements. A memory 620 is connected to processor 614 for storing data packets and program algorithms, and to assist in processing functions of processor 614. These processing functions include the power quality data and revenue calculations, as well as formatting data into different protocols which will be described later in detail. Processor 614 provides processed data to network 680 through network interface 622. Network 680 can be the Internet, the World Wide Web (WWW), an intranet, a wide area network (WAN), or local area network (LAN), among others. In one embodiment, the network interface converts the data to an Ethernet TCP/IP format. The use of the Ethernet TCP/IP format allows multiple users to access the power meter simultaneously. In a like fashion, network interface 622 might be comprised of a modem, cable connection, or other devices that provide formatting functions. Computers 690-692 are shown connected to network 680.

A web server program (web server) is contained in memory 620, and accessed through network interface 622. The web server provides real time data through any known web server interface format. For example, popular web server interface formats consist of HTML and XML formats. The actual format of the programming language used is not essential to the present invention, in that any web server format can be incorporated herein. The web server provides a user friendly interface for the user to interact with the meter 110. The user can have various access levels to enter limits for e-mail alarms. Additionally, the user can be provided the data in a multiple of formats including raw data, bar graph, charts, etc. The currently used HTML or XML programming languages provide for easy programming and user friendly user interfaces.

The operation of the device of FIG. 6 will now be described. Digital sampler 612 samples the voltage and current at and flowing through the point of connection, or sampling point. The voltage and current readings, in the form of data packets, are forwarded to processor 614 where they undergo various power calculations. Processor 614 calculates, for example, instantaneous voltage and current, real power, reactive power, and apparent power. The processing algorithms can be preprogrammed into memory 620, uploaded by an end user, or performed at the end-user's location. The calculations performed by processor 614 are not meant to be all inclusive, as the processor can be programmed to provide any number of preprogrammed or user defined calculations. In addition to performing the calculations, processor 614 sends the packet data to memory 620 to be stored for future access. As digital sampler 612 is sampling the voltage and current at the sampling point, external device 618 can be feeding parallel information to processor 614 through external device interface 616. This external device packet data would be processed and stored in a similar manner as the digital sampler packet data. Processor 614 then formats the processed data into various network protocols and formats. The protocols and formats can, for example, consist of the web server HTML or XML formats, Modbus TCP, RS-485, FTP or e-mail. Dynamic Host Configuration Protocol (DHCP) can also be used to assign IP addresses. The network formatted data is now available to users at computers 690-692 through network 680, that connects to meter 610 at the network interface 622.

In one embodiment of the present invention, network interface 622 is an Ethernet interface that supports, for example, 100 base-T or 10 base-T communications. This type of network interface can send and receive data packets between WAN connections and/or LAN connections and the meter 610. This type of network interface allows for situations, for example, where the web server may be accessed by one user while another user is communicating via the Modbus TCP, and a third user may be downloading a stored data file via FTP. The ability to provide access to the meter by multiple users, simultaneously, is a great advantage over the prior art. This can allow for a utility company's customer service personnel, a customer and maintenance personnel to simultaneously and interactively monitor and diagnose possible problems with the power service.

Figure 7:
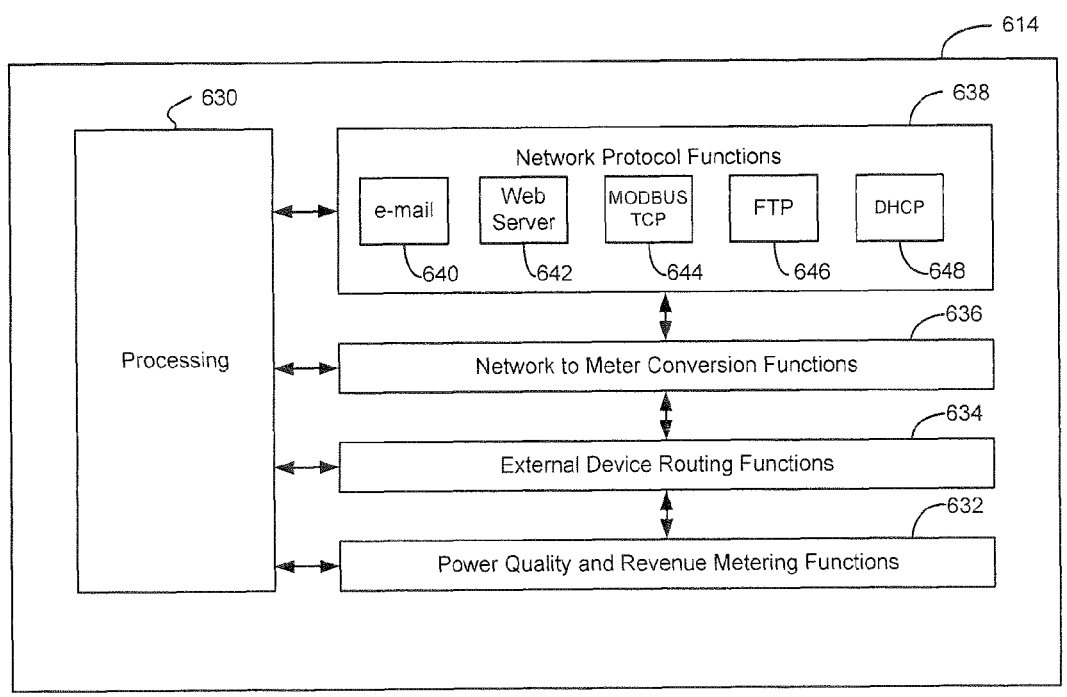
FIG. 7 is a functional block diagram of the processor functions of a power quality and revenue meter system shown in FIG. 6 according to an embodiment of the present disclosure.

FIG. 7 is a functional block diagram of processor 630 of the web server power quality and revenue meter system according to the embodiment of the present invention. FIG. 7 illustrates the functional processing structure of processor 630. Processor 630 is shown containing four main processing functions. Processing 630 can be realized in various memory configurations, and are not limited to any one configuration. The functions shown are illustrative and not meant to be inclusive of all possible functions performed by processor 614. Power Quality and Revenue Metering functions (metering functions) 632 consists of a complete set of functions which are needed for power quality and revenue metering. Packet data collected by digital sampler 612 is transmitted to processor 614. Processor 614 calculates, for example, power reactive power, apparent power, and power factor. The metering function 632 responds to commands via the network or other interfaces supported by the meter. External Device Routing Functions 634 handle the interfacing between the external device 618 and meter 610. Raw data from external device 618 is fed into meter 610. The external device 618 is assigned a particular address. If more than one external device is connected to meter 610, each device will be assigned a unique particular address.

Referring again to FIG. 6, network interface 622 can support, for example, either 100 base-T or 10 base-T communications, and receives and sends data packet between a wide area network (WAN) connection and/or local area network (LAN) connection and the meter. The Network Protocol Functions of meter 610 are executed by processor 614 which executes multiple networking tasks that are running concurrently. As shown in FIG. 7, these include, but are not limited to, the following network tasks included in network protocol functions 638: e-mail 640, web server 642, Modbus TCP 644, FTP 646, and DHCP 648. The e-mail 640 network protocol function can be utilized to send e-mail messages via the network 680 to a user to, for example, notify the user of an emergency situation or if the power consumption reaches a user-set or pre-set high level threshold.

As the processor receives packets of data it identifies the network processing necessary for the packet by the port number associated with the packet. The processor allocates the packet to a task as a function of the port number. Since each task is running independently the meter 610 can accept different types of requests concurrently and process them transparently from each other. For example, the web server may be accessed by one user while another user is communicating via Modbus TCP and at the same time a third user may download a log file via FTP.

The Network to Meter Protocol Conversion Function 636 is used to format and protocol convert the different network protocol messages to a common format understood by the other functional sections of meter 610. After the basic network processing of the packet of data, any "commands" or data which are to be passed to other functional sections of meter 610 are formatted and protocol converted to a common format for processing by the Network to Meter Protocol Conversion Function 636. Similarly, commands or data coming from the meter for transfer over the network are pre-processed by this function into the proper format before being sent to the appropriate network task for transmission over the network. In addition this function first protocol converts and then routes data and commands between the meter and external devices.

The described embodiments of the present disclosure are intended to be illustrative rather than restrictive, and are not intended to represent every embodiment of the present disclosure. Various modifications and variations can be made without departing from the spirit or scope of the disclosure as set forth in the following claims both literally and in equivalents recognized in law.

What is claimed is:

1. An electric power meter for providing simultaneous communications to a plurality of applications, the electric power meter comprising:
    at least one processor configured to perform multiple metering tasks;
    a serial channel coupling the at least one processor to a network adapter, the serial channel operating according to a first protocol; and
    the network adapter configured to receive a data packet using an Ethernet protocol wrapper over an Ethernet connection, remove said Ethernet protocol wrapper, determine a secondary protocol used by said data packet by inspecting said data packet after said Ethernet protocol wrapper is removed, route said data packet to the at least one processor if the determined secondary protocol matches the first protocol, and, if the secondary protocol does not match the first protocol, append a wrapper according to the first protocol to said data packet and route the data packet to the at least one processor after the wrapper is appended to the data packet; wherein
    the at least one processor is further configured to parse said data packet, provide a response packet including electrical energy metering information of said electric power meter using said first protocol and route said response packet to the network adapter over the serial channel; and
    the network adapter is further configured to append an Ethernet protocol wrapper to said response packet and transmit said response packet over said Ethernet connection, wherein said first protocol is a Modbus protocol and said secondary protocol is a Distributed Network Protocol (DNP) protocol and said data packet is a DNP data packet.

2. The electric power meter of claim 1, wherein the network adapter is further configured to append a Modbus wrapper to said DNP data packet and transfer said Modbus wrapped DNP data packet to the at least one processor and the at least one processor is further configured to remove said Modbus wrapper from said DNP data packet and parse said DNP data packet.

3. The electric power meter of claim 2, wherein the at least one processor is further configured to append a Modbus wrapper to said response packet and transfer said Modbus wrapped response packet to said network adapter and the network adapter is further configured to remove said Modbus wrapper from said response packet prior to appending the Ethernet protocol wrapper.

4. The electric power meter of claim 1, further comprising a digital sampler for sampling a voltage and a current at a sampling point coupled to the at least one processor, wherein the at least one processor is configured to perform the multiple metering tasks related to the sampled voltage and current.

5. The electric power meter of claim 4, wherein the multiple metering tasks include executing revenue calculations.

6. The electric power meter of claim 1, further comprising an external device interface for connecting an external device to said electric power meter, wherein said external device transmits packet data to said electric power meter to be processed by the at least one processor and provided through said network adapter.

7. The electric power meter of claim 1, wherein said network adapter supports one of 100 base-T and 10 base-T communications.

8. The electric power meter of claim 1, wherein said Ethernet protocol wrapper is formatted in accordance with Transmission Control Protocol/Internet Protocol (TCP/IP).

9. The electric power meter of claim 1, wherein the at least one processor includes a web server configured to provide data to the network adapter in Hypertext Markup Language (HTML) or Extensible Markup Language (XML) format.

10. An electric power meter for providing simultaneous communications to a plurality of applications, the electric power meter comprising:
at least one processor configured to perform multiple metering tasks;
a serial channel coupling the at least one processor to a network adapter, the serial channel operating according to a first protocol; and
the network adapter configured to receive a data packet using a network protocol wrapper over an Ethernet connection, remove said network protocol wrapper, determine a secondary protocol used by said data packet by inspecting said data packet after said network protocol wrapper is removed, route said data packet to the at least one processor if the determined secondary protocol matches the first protocol, and, if the secondary protocol does not match the first protocol, append a wrapper according to the first protocol to said data packet and route the data packet to the at least one processor after the wrapper is appended to the data packet; wherein
the at least one processor is further configured to parse said data packet, provide a response packet including electrical energy metering information of said electric power meter using said first protocol and route said response packet to the network adapter over the serial channel; and
the network adapter is further configured to append the network protocol wrapper to said response packet and transmit said response packet over said Ethernet connection, wherein said first protocol is a Modbus protocol and said secondary protocol is a Distributed Network Protocol (DNP) protocol and said data packet is a DNP data packet.

11. The electric power meter of claim 10, wherein said network protocol wrapper is in accordance with Modbus Transmission Control Protocol (TCP).

12. The electric power meter of claim 10, wherein said network protocol wrapper is in accordance with RS-485.

13. The electric power meter of claim 10, wherein said network protocol wrapper is in accordance with an e-mail protocol.

14. The electric power meter of claim 10, wherein said network protocol wrapper is in accordance with File Transfer Protocol (FTP).

15. The electric power meter of claim 10, wherein said network protocol wrapper is in accordance with Dynamic Host Configuration Protocol (DHCP).

16. The electric power meter of claim 10, further comprising a digital sampler for sampling a voltage and a current at a sampling point coupled to the at least one processor, wherein the at least one processor is configured to perform the multiple metering tasks related to the sampled voltage and current.

17. The electric power meter of claim 16, wherein the multiple metering tasks include executing revenue calculations.

18. The electric power meter of claim 10, further comprising an external device interface for connecting an external device to said electric power meter, wherein said external device transmits packet data to said electric power meter to be processed by the at least one processor and provided through said network adapter.

19. The electric power meter of claim 10, wherein said network adapter supports one of 100 base-T and 10 base-T communications.

20. An electric power meter for providing simultaneous communications to a plurality of applications, the electric power meter comprising:
at least one processing module configured to perform multiple metering tasks, the at least one processing module coupled to a network adapter; and
the network adapter configured to receive a data packet using a network protocol wrapper over an Ethernet connection, remove said network protocol wrapper, determine a first protocol used by said data packet by inspecting said data packet after said network protocol wrapper is removed and route said data packet to the at least one processing module in a secondary protocol used by the at least one processing module, wherein
the network adapter is further configured to append the network protocol wrapper to a response packet from the at least one processing module and transmit said response packet over said Ethernet connection, wherein said first protocol is a Distributed Network Protocol (DNP) protocol, said data packet is a DNP data packet and said secondary protocol is a Modbus protocol.

21. The electric power meter of claim 20, wherein said network protocol wrapper is in accordance with Modbus Transmission Control Protocol (TCP).

22. The electric power meter of claim 20, wherein said network protocol wrapper is in accordance with an e-mail protocol.

23. The electric power meter of claim 20, wherein said network protocol wrapper is in accordance with File Transfer Protocol (FTP).

24. The electric power meter of claim 20, wherein said network protocol wrapper is in accordance with Dynamic Host Configuration Protocol (DHCP).

25. The electric power meter of claim 20, further comprising a digital sampler for sampling a voltage and a current at a sampling point coupled to the at least one processing module, wherein the at least one processing module is configured to perform the multiple metering tasks related to the sampled voltage and current.

26. The electric power meter of claim 25, wherein the multiple metering tasks include executing revenue calculations.

27. The electric power meter of claim 20, further comprising an external device interface for connecting an external device to said electric power meter, wherein said external device transmits data to said electric power meter to be processed by the at least one processing module and provided through said network adapter.

28. The electric power meter of claim 20, wherein said network adapter supports one of 100 base-T and 10 base-T communications.

29. The electric power meter of claim 20, wherein said network protocol wrapper is formatted in accordance with Transmission Control Protocol/Internet Protocol (TCP/IP).

30. The electric power meter of claim 20, wherein the at least one processing module includes a web server configured to provide data to the network adapter in Hypertext Markup Language (HTML) or Extensible Markup Language (XML) format.

31. An electronic power meter for providing concurrent communications to a plurality of applications, the electronic power meter comprising:
at least one processor configured to perform multiple metering tasks; and
at least one network interface;
the at least one processor configured to receive a data packet from the network interface using a network protocol wrapper over an Ethernet connection, remove said network protocol wrapper and determine a protocol used by said data packet by inspecting said data packet after said network protocol wrapper is removed;
the at least one processor is further configured to append the network protocol wrapper to a response packet and transmit said response packet over said Ethernet connection;
and wherein the at least one processor is configured to respond to simultaneous requests from applications utilizing multiple Ethernet sockets and Ethernet ports utilizing a plurality of protocols, wherein said plurality of protocols are in accordance with Modbus Transmission Control Protocol (TCP) and Distributed Network Protocol (DNP) 3.0.

32. The electronic power meter of claim 31, wherein said plurality of protocols are in accordance with Modbus Transmission Control Protocol (TCP) and DNP 3.0.

33. The electronic power meter of claim 31, wherein said plurality of protocols are two disparate protocols.

34. The electronic power meter of claim 33, wherein the at least one network interface includes an RJ45 connector.

35. The electronic power meter of claim 34, wherein the at least one processor is capable of parsing 100 BaseT Ethernet packets.

36. The electronic power meter of claim 35, wherein the at least one processor is configured to be addressed using DHCP protocol.

37. The electronic power meter of claim 36, wherein the at least one processor is capable of formatting an email message and transmitting said email message through said network interface to an email server.

38. An electronic power meter for providing concurrent communications to a plurality of applications, the electronic power meter comprising:
at least one network interface;
at least one processor configured to perform multiple metering tasks;
the at least one processor configured to receive a data packet from the network interface using a network protocol wrapper over an Ethernet connection, remove said network protocol wrapper and determine a protocol used by said data packet by inspecting said data packet after said network protocol wrapper is removed;
the at least one processor is further configured to append the network protocol wrapper to a response packet and transmit said response packet over said Ethernet connection, wherein the at least one processor is configured to respond to simultaneous requests from applications utilizing multiple Ethernet sockets and Ethernet ports utilizing a plurality of protocols; and
a gateway interface for communicating serial data to slave devices using a serial protocol;
wherein the at least one processor is further configured to format the serial data received by the slave devices and transmit the formatted data via the at least one network interface, wherein said plurality of protocols are in accordance with Modbus Transmission Control Protocol (TCP) and Distributed Network Protocol (DNP) 3.0.

39. The electronic power meter of claim 38 wherein the at least one processor's said formatting includes changing the protocol of the data collected from the slave devices.

40. The electronic power meter of claim 38 wherein the at least one processor's said formatting includes adding an Ethernet wrapper to the data collected from the slave devices.

41. The electronic power meter of claim 38 wherein the at least one processor's said formatting includes modifying the data collected from the slave devices into a different data type.

42. The electronic power meter of claim 38 wherein the at least one processor's said formatting includes modifying the data collected from the slave device into HTML.

43. The electronic power meter of claim 38 wherein the at least one processor's said formatting includes modifying the data collected from the slave device into XML.

44. The electronic power meter of claim 38 wherein the at least one processor's said formatting includes modifying the data collected from the slave device into an email message.

* * * * *